United States Patent
Nakamura et al.

(10) Patent No.: US 6,870,430 B2
(45) Date of Patent: Mar. 22, 2005

(54) PLL-CONTROLLED OSCILLATOR

(75) Inventors: Akihiro Nakamura, Saitama (JP); Kazuo Akaike, Saitama (JP); Kozo Ono, Saitama (JP); Takaaki Ishii, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 112 days.

(21) Appl. No.: 10/456,897

(22) Filed: Jun. 6, 2003

(65) Prior Publication Data

US 2004/0155715 A1 Aug. 12, 2004

(30) Foreign Application Priority Data

Jun. 6, 2002 (JP) ........................................ 2002-166365

(51) Int. Cl.[7] ............................ H03L 1/02; H03L 7/099
(52) U.S. Cl. .............................. 331/18; 331/69; 331/70; 331/108 C; 331/108 D; 331/158; 331/176
(58) Field of Search .......................... 331/1 A, 18, 25, 331/36 C, 65–66, 68–70, 108 C, 108 D, 116 R, 116 FE, 117 R, 117 FE, 117 D, 158, 175, 176, 177 R, 177 V

(56) References Cited

U.S. PATENT DOCUMENTS 6,703,877 B2 * 3/2004 Kobayashi et al. ......... 327/156

FOREIGN PATENT DOCUMENTS

JP 2000-269106 9/2000

* cited by examiner

Primary Examiner—David Mis
(74) Attorney, Agent, or Firm—Knobbe Martens Olson & Bear, LLP

(57) ABSTRACT

A PLL (Phase-Locked Loop)-controlled oscillator has a temperature-compensated crystal oscillator having a quartz crystal unit, an oscillating circuit connected to the crystal unit, and a temperature compensating mechanism for generating a temperature compensating voltage for compensating for frequency vs. temperature characteristics of the crystal unit, and a voltage-controlled oscillator having an LC oscillating circuit, for being controlled by a PLL using the temperature-compensated crystal oscillator as a reference signal source. The temperature-compensated crystal oscillator has circuit components except for the crystal unit, the circuit components and the voltage-controlled oscillator being integrated in a one-chip IC. The one-chip IC and the crystal unit are integrally combined with each other in the PLL-controlled oscillator.

11 Claims, 8 Drawing Sheets

PLL-CONTROLLED OSCILLATOR

BACKGROUND OF THE INVENTION

1. Field of the Invention

The present invention relates to a PLL (Phase-Locked Loop)-controlled oscillator for use in communication systems, and more particularly to a PLL-controlled oscillator to be incorporated in devices such as mobile phones or the like.

2. Description of the Related Art

PLL-controlled oscillators comprise a reference signal source and a voltage-controlled oscillator which is controlled by a PLL based on a reference signal from the reference signal source. The PLL-controlled oscillators are employed in various devices in cellular mobile communication systems in particular, because the oscillating frequency of the voltage-controlled oscillator changes in synchronism with or following a divided frequency from the reference signal source. Usually, the reference signal source comprises a temperature-compensated crystal oscillator, and the voltage-controlled oscillator comprises an LC oscillating circuit having a resonant circuit which is made up of an inductance (L) and a capacitance (C).

FIG. 1 shows a circuit arrangement of a conventional PLL-controlled oscillator by way of example. This PLL-controlled oscillator comprises temperature-compensated crystal oscillator (TCXO) 1 as a reference signal source, voltage-controlled oscillator (VCO) 2, first frequency divider (1st DIV) 11a for dividing a reference frequency from temperature-compensated crystal oscillator 1, second frequency divider (2nd DIV) 11b for dividing an output frequency from voltage-controlled oscillator 2, phase comparator (COMP) 12 for comparing the phases of an output frequency from first frequency divider 11a and an output frequency from second frequency divider 11b, and low-pass filter (LPF) 13 connected to an output terminal of phase comparator 12. Low-pass filter 13 generates a control voltage based on the phase difference that is detected by phase comparator 12, and applies the generated control voltage to voltage-controlled oscillator 2. With the circuit arrangement shown in FIG. 1, voltage-controlled oscillator 2 is controlled by a PLL. Specifically, the output frequency of voltage-controlled oscillator 2 follows the frequency of a signal which is produced when the reference frequency is divided by first frequency divider 11a.

As shown in FIG. 2, temperature-compensated crystal oscillator 1 has a structure which comprises a casing 7 having a recess which accommodates therein quartz crystal unit 3 and IC (integrated circuit) chip 6. Casing 7 has a step in the recess, and crystal unit 3 consists of quartz crystal blank 3A having an end fixed to the step by electrically conductive adhesive 9. IC chip 6 is fixedly mounted on the bottom face of the recess. Cover 8 is bonded to casing 7 in covering relation to the recess, thus hermetically sealing crystal unit 3 and IC chip 6 in casing 7. Although not shown in FIG. 2, a connection electrode is disposed on the step and electrically connected to crystal blank 3A. The connection electrode is also electrically connected to IC chip 6 by a circuit pattern (not shown), thus electrically connecting IC chip 6 and crystal blank 3A (crystal unit 3) to each other.

As shown in FIG. 3, temperature-compensated crystal oscillator 1 has a circuit arrangement comprising crystal unit 3, oscillating circuit 4 connected to a terminal of crystal unit 3, voltage-variable capacitance element 10 such as a variable-capacitance diode connected to the other terminal of crystal unit 3 and ground, and temperature compensating mechanism 5 for measuring an ambient temperature, generating a temperature compensating voltage based on the ambient temperature, and applying the temperature compensating voltage to voltage-variable capacitance element 10. IC chip 6 includes an integrated assembly of oscillating circuit 4 and temperature compensating mechanism 5. A write terminal (not shown) is disposed on an outer side surface of casing 7 for writing temperature compensating data in temperature compensating mechanism 5.

Generally, crystal unit 3 comprises an AT-cut quartz crystal blank and has frequency vs. temperature characteristics represented by a cubic curve having an inflection point near the normal temperature of 25° C. Oscillating circuit 4 is constructed as a Colpitts oscillator using an inverter amplifier, and uses voltage-variable capacitance element 10 as an oscillating capacitor. Temperature compensating mechanism 5 has a sensor element such as a temperature-sensitive resistor for detecting an ambient temperature, and a voltage generating circuit for generating a temperature compensating voltage which varies according to a cubic function based on the detected temperature. The generated temperature compensating voltage is applied to voltage-variable capacitance element 10 to change a series equivalent capacitance (i.e., load capacitance) as seen across crystal unit 3, thereby compensating for a change in the resonant frequency of crystal unit 3 due to a change in the ambient temperature for keeping the oscillating frequency constant.

Voltage-controlled oscillator 2 comprises an LC oscillating circuit of the Colpitts type, for example, and includes a voltage-variable capacitance element inserted in the closed oscillation loop. The output frequency of voltage-controlled oscillator 2 varies in response to the control voltage that is applied to the voltage-variable capacitance element. Voltage-controlled oscillator 2 has a specific circuit arrangement which is basically equivalent to the circuit arrangement shown in FIG. 3 except that the temperature compensating mechanism is dispensed with and an LC resonating circuit is used in place of crystal unit 3.

The PLL-controlled oscillator described above is used in a transmission/reception system of a cellular phone, for example. One example of such a transmission/reception system of a cellular phone is illustrated in FIG. 4.

The transmission/reception system has temperature-compensated crystal oscillator (TCXO) 1 as a common reference signal source, transmission voltage-controlled oscillator (TXVCO) 2a which is PLL-controlled using the common reference signal source, and reception voltage-controlled oscillator (RXVCO) 2b which is PLL-controlled using the common reference signal source. For signal transmission, an output frequency in a 900 MHz band, for example, from transmission voltage-controlled oscillator 2a and modulated signal fa containing information such as audio information are mixed with each other by mixer 14a, and a generated high-frequency signal is transmitted via power amplifier (PA) 15 and radiated from antenna 16. For signal reception, a high-frequency signal received from antenna 16 and transmitted through low-noise amplifier (LNA) 17 and an output frequency from reception voltage-controlled oscillator 2b are mixed with each other by mixer 14b, producing demodulated signal fb. Information such as audio information is extracted from demodulated signal fb. As shown in FIG. 5, the above transmission/reception system physically comprises high-functionality IC 18 for generating a modulated signal and a demodulated signal, and discrete components 19 which serve as temperature-compensated crystal oscillator 1 and transmission and reception voltage-controlled oscillators 2a, 2b. High-function IC 18 and discrete components 19 being mounted on setting board (wiring board) 17.

Since temperature-compensated crystal oscillator 1 and voltage-controlled oscillator 2 are constructed separately from each other, the above PLL-controlled oscillator has low productivity and is manufactured at a high cost. It is difficult to reduce the physical size of voltage-controlled oscillator 2 because it is made up of capacitors and inductors constructed as chip elements and many discrete components including amplifiers and voltage-variable capacitance elements. The more the components used, the more complex circuit patterns for interconnecting the components becomes, tending to produce an electromagnetic coupling between the circuit patterns, which is likely to cause a trouble in the PLL-controlled oscillator.

SUMMARY OF THE INVENTION

It is an object of the present invention to provide a PLL-controlled oscillator which can be reduced in size, is highly productive, and has improved electric performance.

According to the present invention, the above object can be achieved by a PLL-controlled oscillator having a temperature-compensated crystal oscillator and a voltage-controlled oscillator which are integrally combined with each other.

According to a first aspect of the present invention, there is provided a PLL-controlled oscillator comprising a temperature-compensated crystal oscillator having a crystal unit, an oscillating circuit connected to the crystal unit, and a temperature compensating mechanism for generating a temperature compensating voltage for compensating for frequency vs. temperature characteristics of the crystal unit, and a voltage-controlled oscillator having an LC oscillating circuit, for being controlled by a PLL using the temperature-compensated crystal oscillator as a reference signal source. In this PLL-controlled oscillator, the temperature-compensated crystal oscillator has circuit components except for the crystal unit, the circuit components and the voltage-controlled oscillator are integrated in a one-chip IC, the one-chip IC and the crystal unit are integrally combined with each other.

According to a second aspect of the present invention, there is provided a PLL-controlled oscillator comprising a temperature-compensated crystal oscillator having a crystal unit, an oscillating circuit connected to the crystal unit, and a temperature compensating mechanism for generating a temperature compensating voltage for compensating for frequency vs. temperature characteristics of the crystal unit, and a voltage-controlled oscillator having an LC oscillating circuit including an inductor and a capacitor as frequency determining elements, for being controlled by a PLL using the temperature-compensated crystal oscillator as a reference signal source, wherein the temperature-compensated crystal oscillator has circuit components except for the crystal unit, the voltage-controlled oscillator has circuit components except for either one of the inductor and the capacitor, the circuit components of the temperature-compensated crystal oscillator and the circuit components of the voltage-controlled oscillator are integrated in a one-chip IC, and the one-chip IC and the crystal unit are integrally combined with each other.

According to a third aspect of the present invention, there is provided a PLL-controlled oscillator comprising a casing having a first recess and a second recess which are defined therein, a temperature-compensated crystal oscillator having a crystal blank, an oscillating circuit connected to the crystal blank, and a temperature compensating mechanism for generating a temperature compensating voltage for compensating for frequency vs. temperature characteristics of the crystal blank, and a voltage-controlled oscillator having an LC oscillating circuit including an inductor and a capacitor as frequency determining elements, for being controlled by a PLL using the temperature-compensated crystal oscillator as a reference signal source, wherein the temperature-compensated crystal oscillator has circuit components except for the crystal blank, the voltage-controlled oscillator has circuit components except for either one of the inductor and the capacitor, the circuit components of the temperature-compensated crystal oscillator and the circuit components of the voltage-controlled oscillator are integrated in a one-chip IC, the one-chip IC and the crystal blank are accommodated in the first recess, and the one of the inductor and the capacitor are accommodated in the second recess.

The PLL-controlled oscillator according to the present invention can be greatly reduced in size, has high electrical performance, has a simplified wiring pattern on a circuit board, and is highly productive.

DETAILED DESCRIPTION OF THE INVENTION

Figure 1:
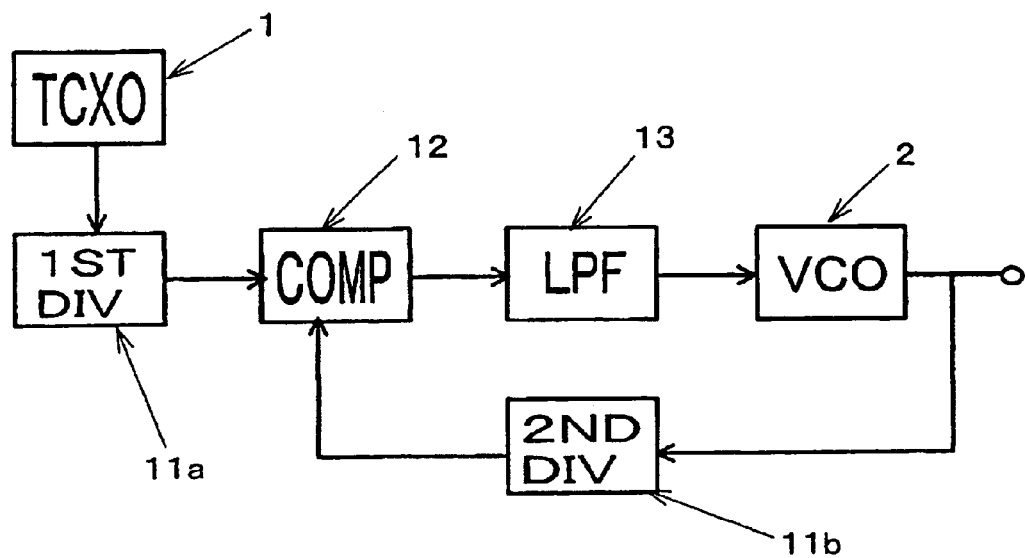
FIG. 1 is a block circuit diagram of an example of a conventional PLL-controlled oscillator.
Figure 2:
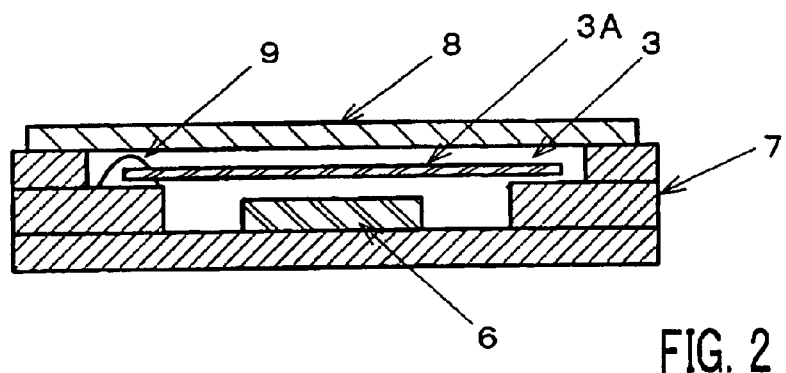
FIG. 2 is a cross-sectional view of a conventional temperature-compensated crystal oscillator.
Figure 6:
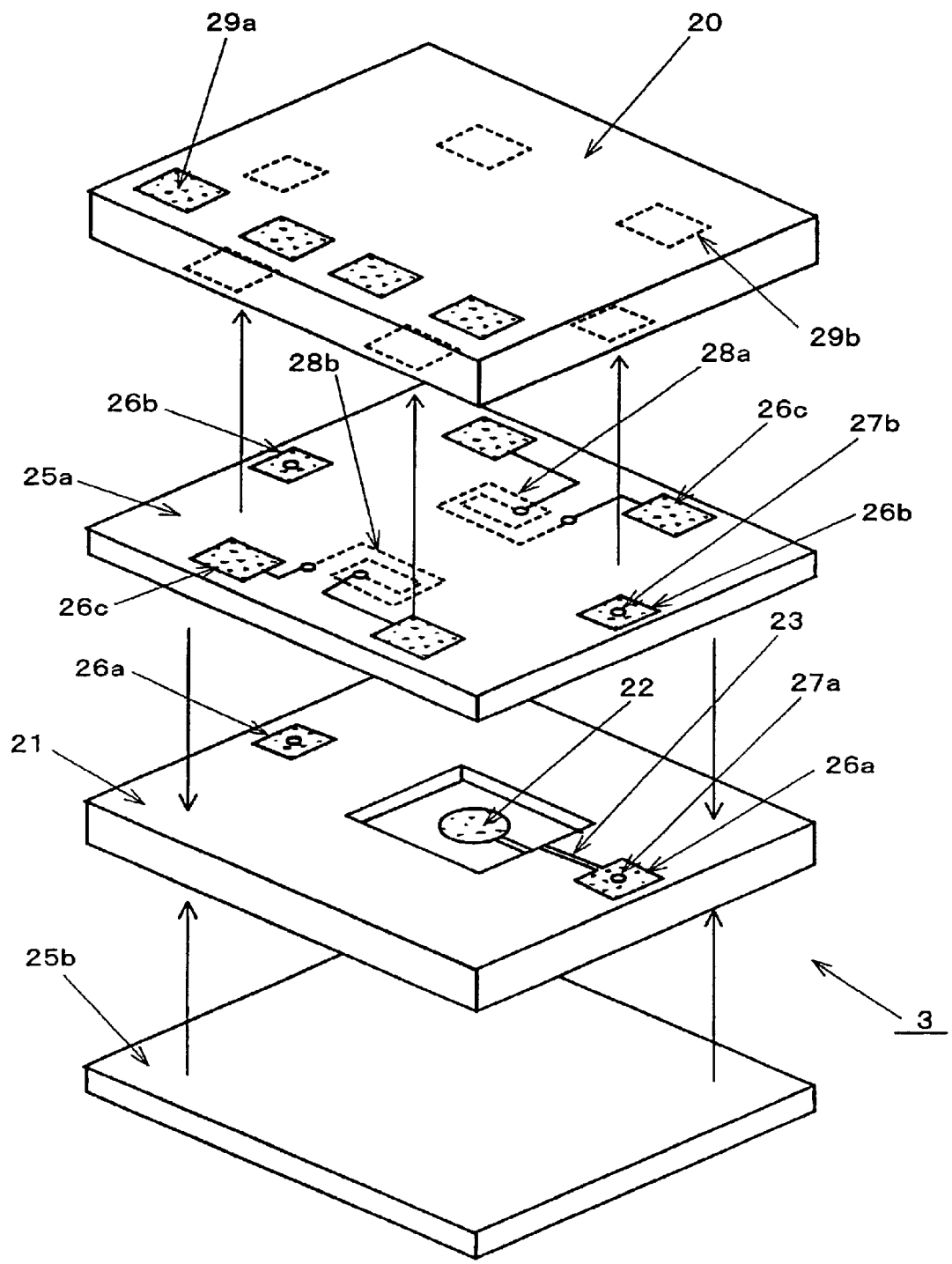
FIG. 6 is an exploded perspective view of a PLL-controlled oscillator according to a first embodiment of the present invention.
Figure 7:
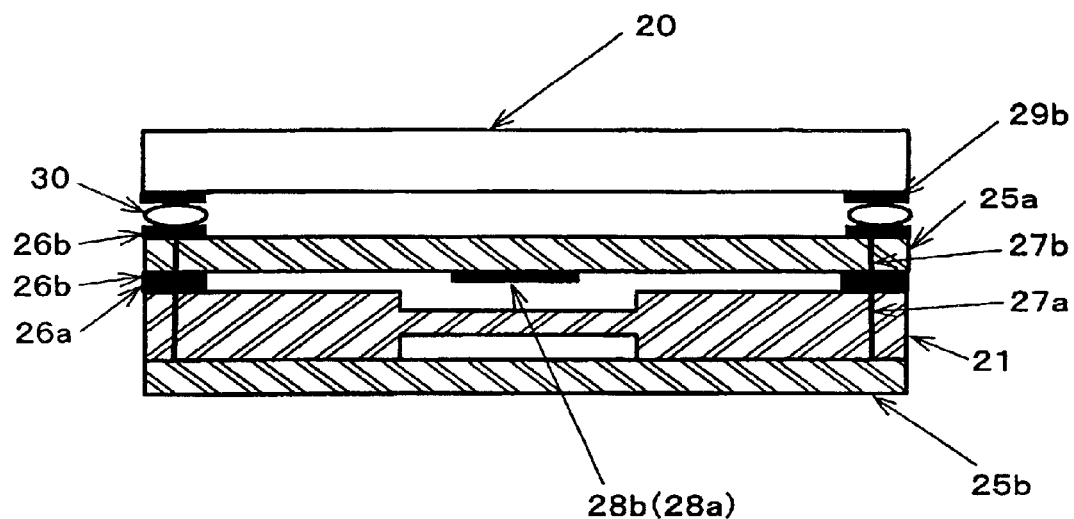
FIG. 7 is a schematic cross-sectional view of the PLL-controlled oscillator according to the first embodiment.

A PLL-controlled oscillator according to a first embodiment of the present invention comprises, in the same manner as the conventional circuit shown in FIG. 1, a temperature-compensated crystal oscillator as a reference signal source and a voltage-controlled oscillator which is controlled by a PLL. The voltage-controlled oscillator comprises an LC oscillating circuit and a voltage-variable capacitance element. To make the PLL-controlled oscillator applicable to a transmission/reception system of a cellular phone, the PLL-controlled oscillator has a temperature-compensated crystal oscillator as a common reference signal source, a transmission voltage-controlled oscillator which is PLL-controlled using the common reference signal source, and a reception voltage-controlled oscillator which is PLL-controlled using the common reference signal source. Components of the temperature-compensated crystal oscillator except for a quartz crystal unit thereof, and components of each of the voltage-controlled oscillators except for inductors (L) of LC oscillating circuits thereof are integrated on one-chip IC 20 (see FIG. 6). As shown in FIGS. 6 and 7, the PLL-controlled oscillator according to the first embodiment has the crystal unit and inductors 28a, 28b of the LC oscillating circuits superposed on one-chip IC 20, so that the temperature-compensated crystal oscillator and the voltage-controlled oscillators are essentially integrally combined with each other.

Figure 3:
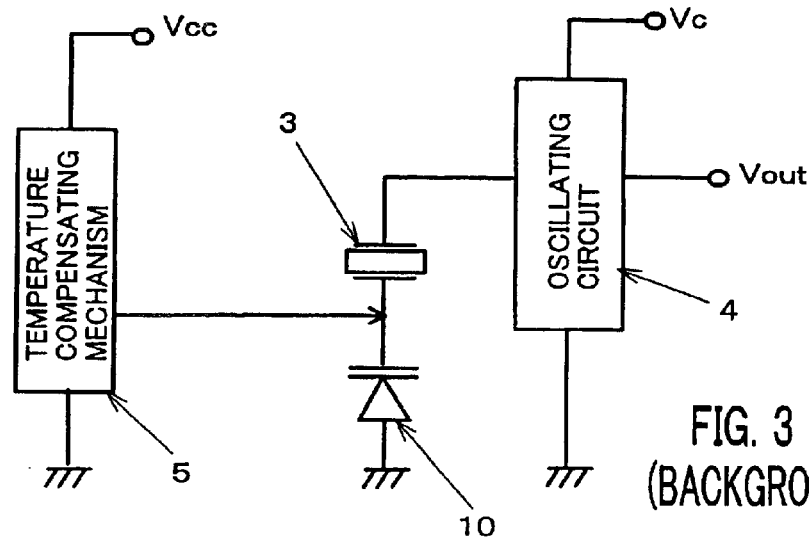
FIG. 3 is a block circuit diagram of an example of the conventional temperature-compensated crystal oscillator.
Figure 4:
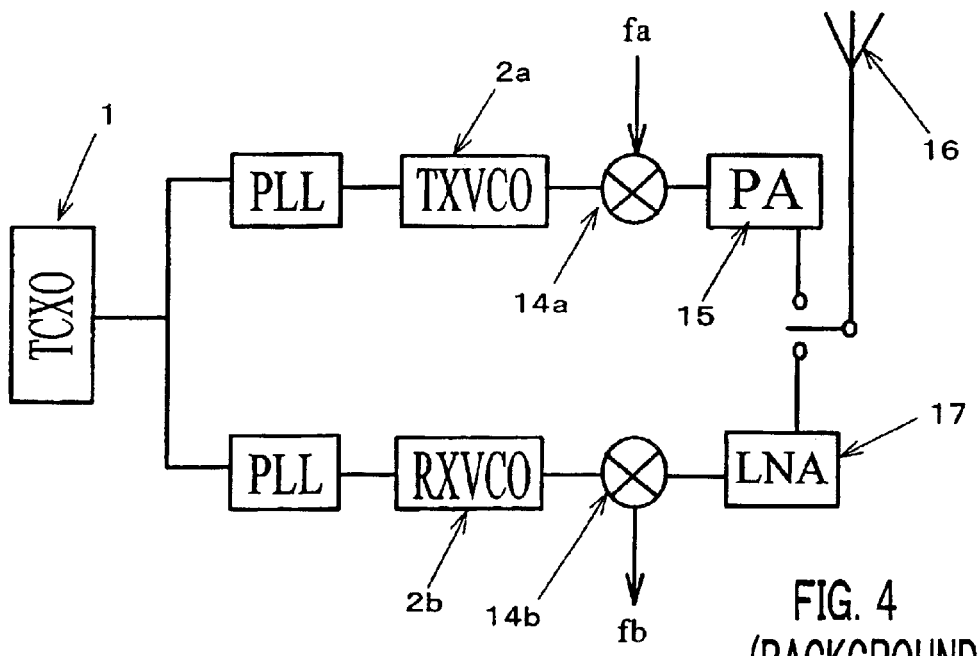
FIG. 4 is a block system diagram of an example of a transmission/reception system.

Specifically, one-chip IC 20 incorporates therein components of the circuit shown in FIG. 3, except crystal unit 3, i.e., oscillating circuit 4, temperature compensating circuit 5, and voltage-variable capacitance element 10, and components of the circuits of the voltage-controlled oscillators except for inductors 28a, 28b of the LC oscillating circuits. The LC oscillating circuit has two reactance elements, i.e., capacitors (C) and inductors (L), as oscillating frequency determining elements. According to the present embodiment, of these reactance elements, the capacitors are integrated in one-chip IC 20, and inductors 28a, 28b are disposed outside of one-chip IC 20.

As shown in FIG. 1, the PLL-controlled oscillator generally further includes frequency dividers 11a, 11b, low-pass filter 13, and phase comparator 12. These components may also be integrated in one-chip IC 20, or integrated in high-functionality IC 18 shown in FIG. 5. If the frequency-dividing ratios of frequency dividers 11a, 11b need to be controlled, then these frequency dividers 11a, 11b should preferably be integrated in high-functionality IC 18, and accordingly low-pass filter 13 and phase comparator 12 may also be integrated in high-functionality IC 18.

The crystal unit according to the present embodiment is of an inverted-mesa structure including quartz crystal panel 21 as a crystal unit which has mutually confronting recesses defined in central regions of respective principal surfaces thereof. The region of quartz crystal panel 21 in the recesses, i.e., the thin region thereof, serves as a vibrating region, and the thicker region around the vibrating region serves as a retaining region. The vibration region corresponds to a quartz crystal blank constituting crystal unit 3. Crystal unit 3 has a resonant frequency which is generally determined by the thickness of quartz crystal panel 21 in the vibration region. Excitation electrodes 22 are formed on the bottom faces of the respective recesses in quartz crystal panel 21. From excitation electrodes 22, there extend respective extension electrodes 23 toward the retaining region around the vibrating region. Extension electrodes 23 extend in opposite directions to respective opposite ends of quartz crystal panel 21, and have distal ends connected to connecting terminals 26a. Connecting terminals 26a are folded back onto the respective other principal surfaces of quartz crystal plate 21 via through holes 27a, for example.

Covers 25a, 25b, which are made of the same material as quartz crystal panel 21 or glass whose thermal expansion coefficient is close to that of quartz crystal, are directly bonded to the respective principal surfaces of quartz crystal panel 21. The direct bonding refers to the formation of a chemical bond between atoms on a surface of one member and atoms on a surface of another member, thus joining the members to each other. In the present embodiment, since quartz crystals are directly bonded to each other or a quartz crystal and glass are directly bonded to each other, a siloxane bond (Si—O—Si) is formed between the two materials. Details of the direct bonding are disclosed in Japanese laid-open patent publication No. 2000-269106 (JP, P2000-269106, A). In the present embodiment, the surface of the retaining region of quartz crystal panel 21 is polished to a mirror finish, and the surfaces of the covers are polished to a mirror finish. The polished surfaces are then chemically processed to modify themselves with a hydrophilic group, typically a —OH group (hydroxyl group). Thereafter, the surfaces are held against each other and heated. As a result, $H_2O$ is desorbed from the hydroxyl groups on the surfaces by dehydration, producing a siloxane bond.

When covers 25a, 25b are thus bonded to quartz crystal panel 21, crystal unit 3 with the crystal blank hermetically sealed therein is completed. The retaining region of quartz crystal panel 21 and both covers 25a, 25b jointly make up the casing of crystal unit 3.

A pair of connecting terminals 26b are formed on one of covers 25a at respective positions aligned with respective connecting terminals 26a of quartz crystal panel 21. Connecting terminals 26b are formed on both the principal surfaces and electrically connected to each other via through holes 27a. Two inductors 28a, 28b are printed on the principal surface of cover 25a which is not joined to quartz crystal panel 21. These inductors 28a, 28b serve as the inductors of the LC resonating circuits of the voltage-controlled oscillators as described above. With this structure, inductors 28a, 28b are disposed within the casing of crystal unit 3. Connecting terminals 26c are also formed on the principal surface of cover 25a and connected to respective ends of inductors 28a, 28b. Although not shown, shield layers comprising electrically conductive films are formed on the principal surfaces of covers 25a, 25b which are not joined to quartz crystal panel 21, except for the locations of the connecting terminals. These shield layers should preferably be connected to ground.

IC terminals 29a including an output terminal, a power supply terminal, and a ground terminal are disposed on the upper surface, as shown, of one-chip IC 20 and arrayed along outer peripheral edges thereof. IC terminals 29b which are connected to crystal unit 3 and inductors 28a, 28b are disposed on the lower surface, as shown, of one-chip IC 20. IC terminals 29b are connected to connecting terminals 26b on cover 25a which are connected to crystal unit 3 and connecting terminals 26c on cover 25a which are connected to inductors 28a, 28b, by bumps 30 according to an ultrasonic thermal-compression process. A write terminal (not shown) is disposed on the upper surface of one-chip IC 20 for writing temperature compensating data in the temperature compensating mechanism.

FIG. 7 schematically shows the PLL-controlled oscillator according to the present embodiment. Though quartz crystal panel 21 and cover 26a are shown as not being in close contact with each other, they are actually held in close contact with each other by the direct bonding as described above. Since quartz crystal panel 21 and cover 25a, 25b are held in close contact with each other, the vibrating region of quartz crystal panel 21 is hermetically sealed, so that the characteristics of crystal unit 3 are prevented from being degraded.

For manufacturing the PLL-controlled oscillator, one-chip IC 20 is first joined by bumps 30 to the upper surface of cover 25a to which inductors 28a, 28b and the connecting terminals have been already disposed. Inductors 28a, 28b are now electrically connected to the transmission and reception voltage-controlled oscillators in one-chip IC 20, thus completing the LC oscillating circuits of the voltage-controlled oscillators. While the voltage-controlled oscillator are in operation, the inductors are trimmed by a laser to change the line length and inductance for thereby adjusting the oscillating frequency (nominal frequency) of the voltage-controlled oscillators.

Then, one principal surface of quarts crystal panel 21 is directly bonded to cover 25a to which oscillating one-chip IC 20 has already been connected. Excitation electrodes and the like have already been mounted on quartz crystal panel 21. Under the pressure applied when the principal surface of crystal oscillator 21 is directly bonded to cover 25a, connecting terminals 26a of quartz crystal panel 21 and connecting terminals 26b of cover 25a are brought into contact with each other to electrically connect oscillating circuit 4 in one-chip IC 20 and crystal unit 3 to each other, thus completing temperature-compensated crystal oscillator 1. Then, while temperature-compensated crystal oscillator 1 is in operation, an ion beam, for example, is applied from the other principal surface side of quartz crystal panel 21 to excitation electrodes 22, reducing the mass of excitation electrodes 22 to adjust the oscillating frequency of the crystal oscillator. Finally, cover 25b is directly bonded to the other principal surface of quartz crystal panel 21 for a crystal unit.

According to the present embodiment, the circuit components except for crystal unit 3 of temperature-compensated crystal oscillator 1 and inductors 28a, 28b of voltage-controlled oscillator 2 are integrated in one-chip IC 20. The assembly of crystal unit 3 and inductors 28a, 28b is stacked on one-chip IC 20, proving an integral structure. Thus, the PLL-controlled oscillator is made up of a greatly reduced number of parts, can be reduced in size, and can be manufactured at a reduced cost. As the number of parts used is reduced, a circuit pattern on which the parts are mounted is simplified, so that adverse effects caused by an electromagnetic coupling are reduced, allowing the PLL-controlled oscillator to have good electrical characteristics.

Figure 5:
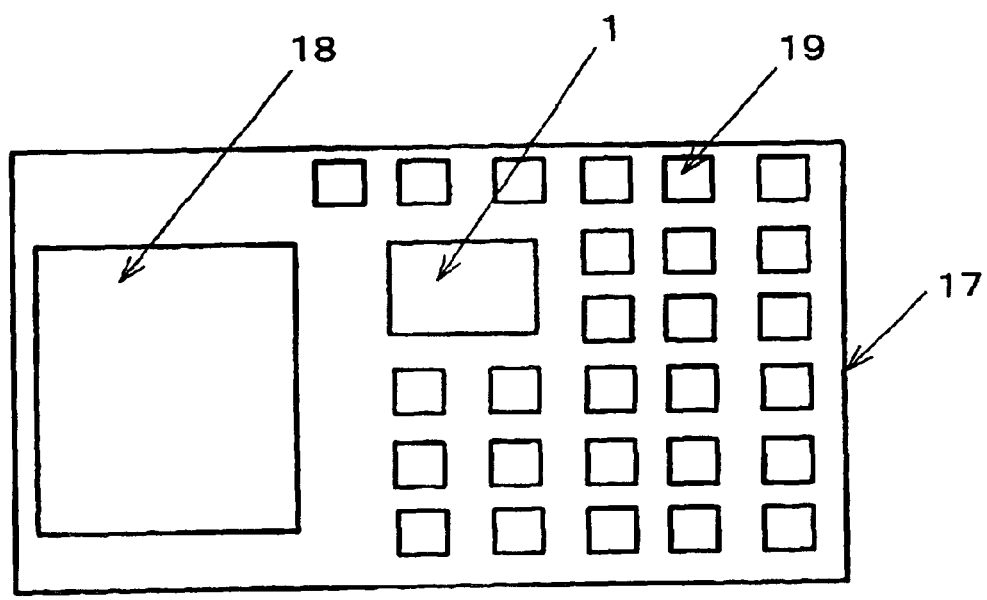
FIG. 5 is a plan view showing the layout of components and elements of the transmission/reception system on a setting board.
Figure 8A:
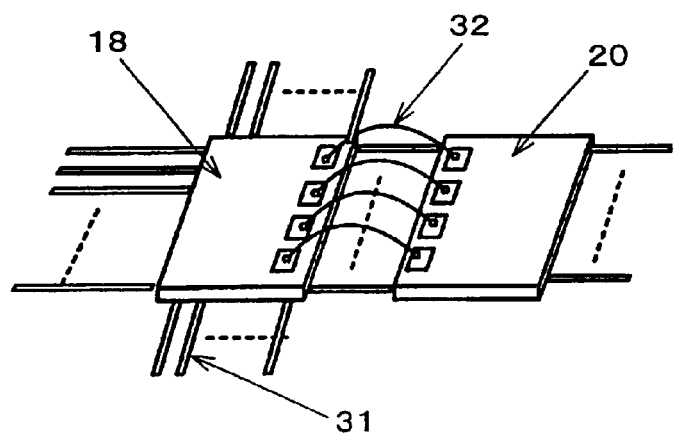
FIGS. 8A and 8B are an exploded perspective view and a plan view, respectively, of a multichip IC in the first embodiment.
Figure 8B:
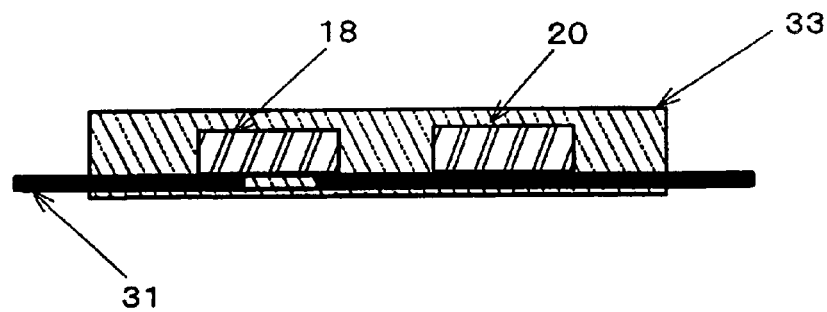

As shown in FIGS. 8A and 8B, the PLL-controlled oscillator according to the present embodiment has metal frames 31 that are used as external terminals, high-functionality IC chip 18 connected to metal frames 31, and one-chip IC 20 connected to high-functionality IC chip 18 by wires 32 according to wire bonding. Metal frames 31, high-functionality IC chip 18, and one-chip IC 20 are integrally encased by molded synthetic resin 33, thus producing a multichip IC as a transmission/reception device including modulating and demodulating functions. Therefore, the PLL-controlled oscillator can be installed in a space with a much greater margin and designed with greater freedom than the conventional PLL-controlled oscillator which has a high-functionality IC chip and discrete components mounted on the setting board as shown in FIG. 5. The single PLL-controlled oscillator shown in FIG. 6 may also be encased by a molded synthetic resin for use as an independent circuit component.

A PLL-controlled oscillator according to a second embodiment of the present invention will be described below.

Figure 9:
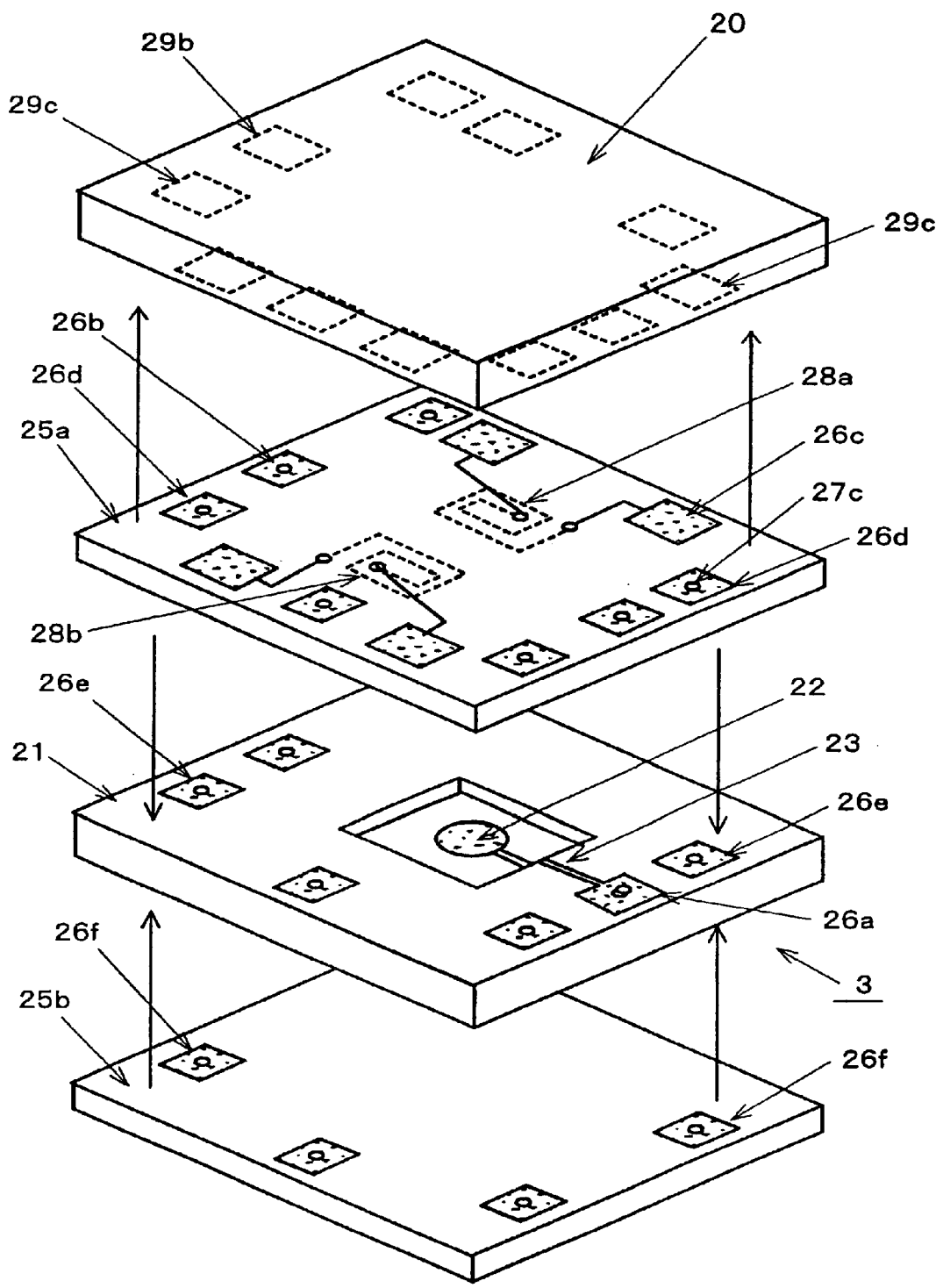
FIG. 9 is an exploded perspective view of a PLL-controlled oscillator according to a second embodiment of the present invention.

In the first embodiment, IC terminals are disposed on both principal surfaces of one-chip IC 20. However, as shown in FIG. 9, the PLL-controlled oscillator according to the second embodiment has IC terminals disposed on only one principal surface of one-chip IC 20. Specifically, according to the second embodiment, IC terminals 29b for connection to crystal unit 3 and inductors 28a, 28b and IC terminals 29c including a power supply terminal, a ground terminal, an output terminal and the like are disposed on the lower surface of one-chip IC 20 for oscillation. IC terminals 29b, 29c are disposed on the principal surface of one-chip IC 20 and arrayed along outer peripheral edges thereof.

Connecting terminals 26b, 26c for connection to crystal unit 3 and inductors 28a, 28b and connecting terminals 26d aligned with IC terminals 29c are disposed along outer peripheral edges of cover 25a. Connecting terminals 26d are disposed on both principal surfaces of cover 25a and electrically connected to each other via through holes 27c.

Similarly, connecting terminals 26e are disposed on both principal surfaces of quartz crystal panel 21 in alignment with connecting terminals 26d of cover 25a, and connecting terminals 26f are disposed on both principal surfaces of cover 25b in alignment with connecting terminals 26e of quartz crystal panel 21. Connecting terminals 26f are exposed on the outer surfaces of cover 25b, and connected to high-functionality IC chip 18 by wires 32 by wire bonding process as described above. In the present embodiment, a multichip IC with an integral transmission/reception system can be provided. The single PLL-controlled oscillator shown in FIG. 9 may also be encased by a molded synthetic resin for use as an independent circuit component.

Figure 10A:
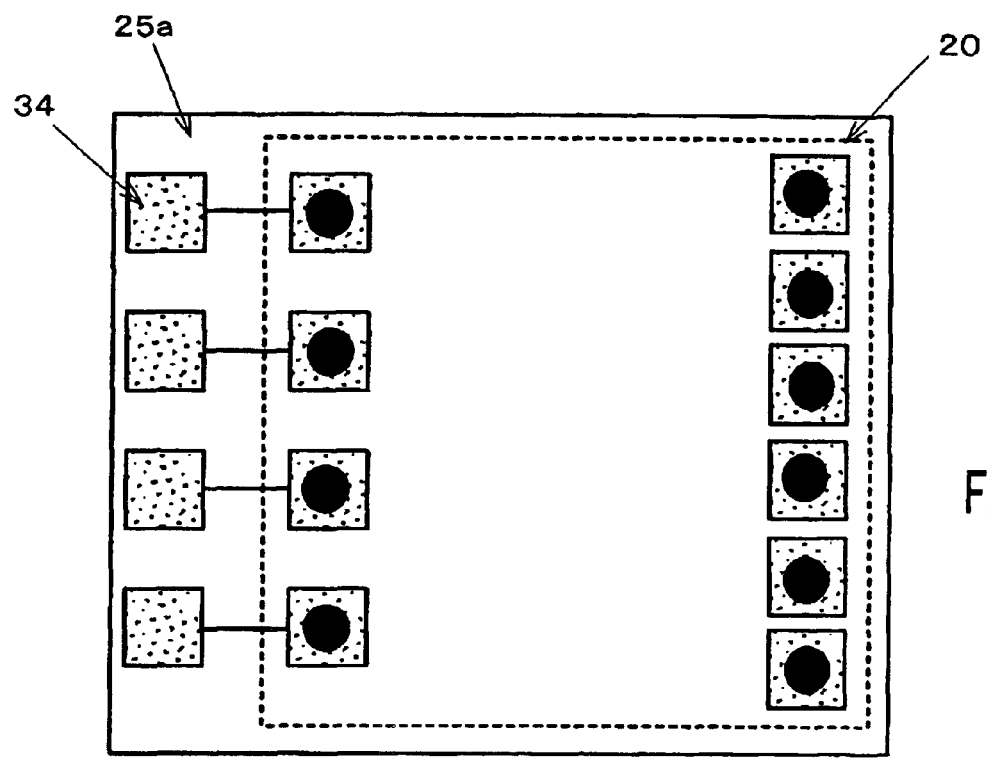
FIGS. 10A and 10B are a plan view and a cross-sectional view, respectively, of a PLL-controlled oscillator according to a third embodiment of the present invention.
Figure 10B:
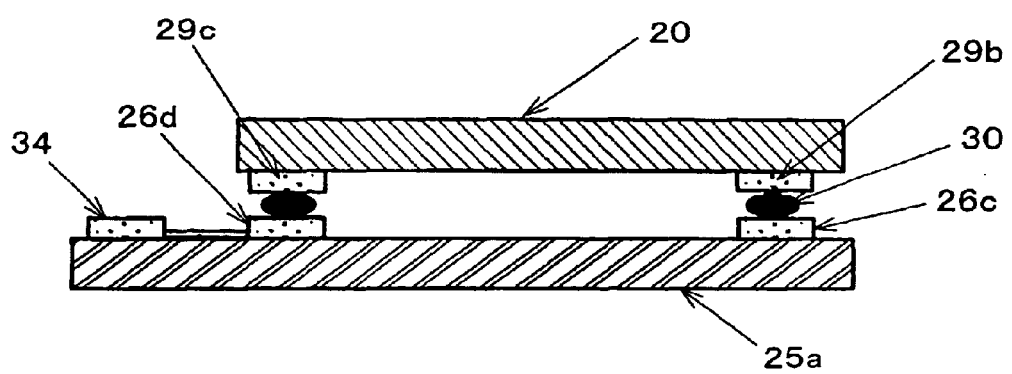

A PLL-controlled oscillator according to a third embodiment of the present invention will be described below with reference to FIGS. 10A and 10B. In the second embodiment, IC terminals are disposed on only one principal surface of one-chip IC 20 for oscillation, and IC terminals for external connection are electrically extended to an outer surface of cover 25b via connecting electrodes and through holes on covers 25a, 25b and quartz crystal panel 21. In the third embodiment, connecting electrodes are electrically extended to an outer surface of cover 25a to which one-chip IC 20 is connected.

Specifically, according to the third embodiment, quartz crystal panel 21 and covers 25a, 25b have planar profile sizes greater than the planar profile size of one-chip IC 20. In FIG. 10B, components positioned below cover 25a, i.e., quartz crystal panel 21 and cover 25b, are omitted from illustration. IC terminals 29b for connection to crystal unit 3 and inductors 28a, 28b and IC terminals 29c including a power supply terminal, an output terminal, and a ground terminal are disposed on one principal surface of one-chip IC 20. IC terminals 29b are disposed in an array on one end of one-chip IC 20, and IC terminals 29c are disposed in an array on the other end of one-chip IC 20. Connecting terminals 26d are disposed on an outer surface of cover 25a in alignment with IC terminals 29c, and leading connecting terminals 34 connected to connecting terminals 26d are disposed on the outer surface of cover 25a. Leading connecting terminals 34 are disposed on an end of the outer surface of cover 25a over which one-chip IC 20 is not positioned.

With the above structure, as with the previous embodiments, the high-functionality IC chip and leading connecting terminals 34 can be connected to each other by wire bonding. As a result, a multichip IC incorporating a transmission/reception system and encased by a molded synthetic resin can be provided. The single PLL-controlled oscillator shown in FIGS. 10A and 10B may also be encased by a molded synthetic resin for use as an independent circuit component.

Figure 11:
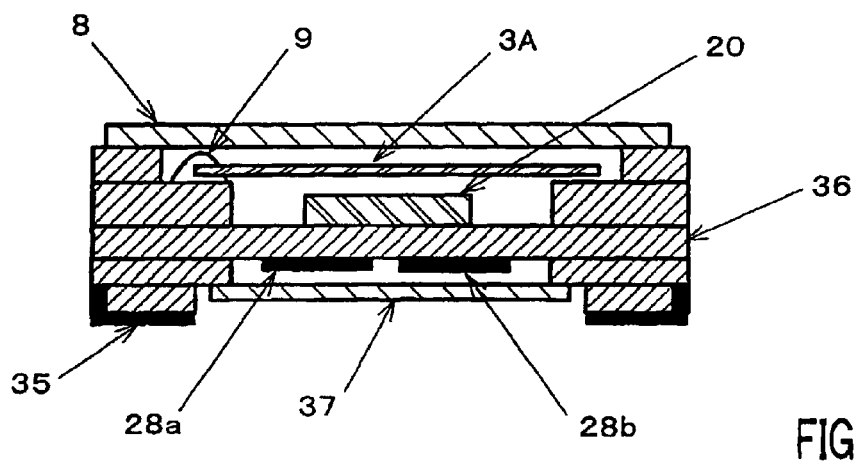
FIG. 11 is a cross-sectional view of a PLL-controlled oscillator according to a fourth embodiment of the present invention.

A PLL-controlled oscillator according to a fourth embodiment of the present invention will be described below with reference to FIG. 11. In the above various embodiments, a PLL-controlled oscillator is implemented by a multichip IC incorporating a transmission/reception system and connected to a high-functionality IC chip. According to the fourth embodiment, a PLL-controlled oscillator functions as an independent device.

The PLL-controlled oscillator according to the fourth embodiment has casing 36 made of laminated ceramics and having recesses defined respectively in opposite principal surfaces thereof. Casing 36 is of an H-shaped cross section as shown in FIG. 11. Steps are formed on inner wall surfaces of the recesses in casing 36. Mounting electrodes 35 for surface-mounting casing 36 on a printed wiring board or the like are formed on an outer surface of casing 36. One-chip IC 20 for oscillation is fixedly mounted on the bottom of the upper recess, as shown, and substantially rectangular crystal blank 3A has opposite sides at one end thereof fixed to a step in the upper recess by electrically conductive adhesive 9. Cover 8 is mounted on casing 36 in covering relation to the opening of the upper recess, thus hermetically sealing crystal blank 3A and one-chip IC 20 in casing 36. As with the PLL-controlled oscillators described above, one-chip IC 20 incorporates an integrated assembly of those components of the temperature-compensated crystal oscillator except for crystal unit 3 (crystal blank 3A) and those components of the transmission and reception voltage-controlled oscillators except for inductors 28a, 28b of the LC oscillating circuits. The frequency dividers, the phase comparator, and the low-pass filter may also be integrated in one-chip IC 20. Crystal blank 3A is connected to one-chip IC 20 by electrically conductive adhesive 9 and an electrically conductive pattern (not shown) formed on casing 36. Mounting electrodes 35 are electrically connected to one-chip IC 20 via non-illustrated through holes defined in casing 36.

Inductors 28a, 28b are formed as printed conductive patterns on the bottom of the lower recess, as shown, in casing 36. In the lower recess, shield plate 37 connected to the ground potential is joined to the steps. After the voltage-controlled oscillators are actually operated to measure an oscillating frequency and inductors 28a, 28b are adjusted by laser trimming, shield plate 37 is joined to the steps in the lower recess. Inductors 28a, 28b are electrically connected to one-chip IC 20 via non-illustrated through holes defined in casing 36. If the oscillating frequency of the PLL-controlled oscillator is low, then chip inductors may be used as inductors 28a, 28b.

In the present embodiment, the PLL-controlled oscillator includes an integral combination of the temperature-compensated crystal oscillator and the voltage-controlled oscillator, and can greatly be reduced in size.

Figure 12:
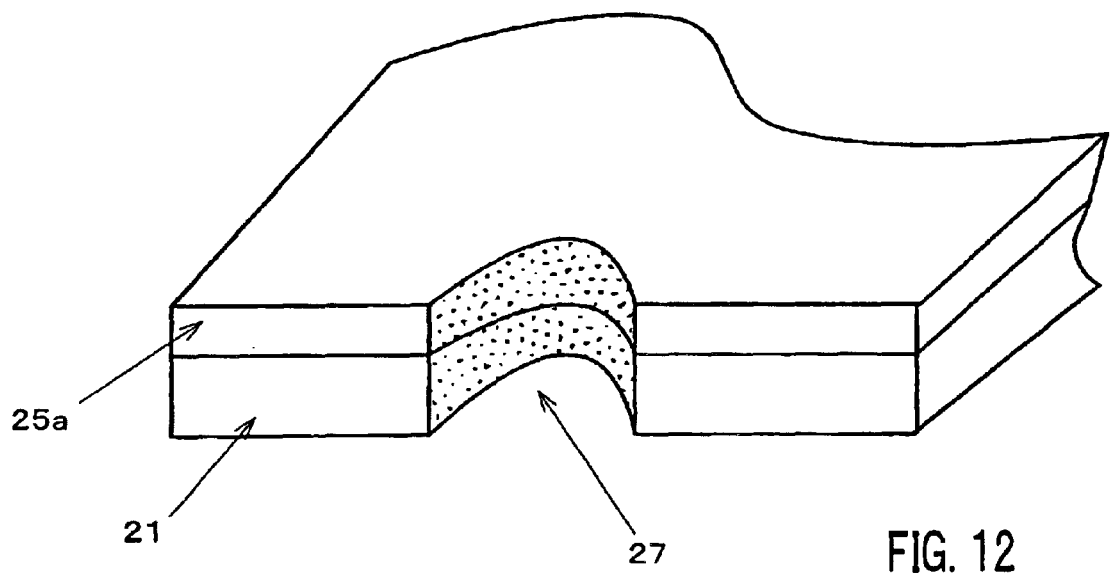
FIG. 12 is an enlarged fragmentary perspective view of a PLL-controlled oscillator according to another embodiment of the present invention.

In the embodiments described above, connecting terminals 26a of quartz crystal panel 21 and connecting terminals 26b of cover 25a are electrically connected to each other under the pressure of direct bonding. However, as shown in FIG. 12, through hole 27 may be divided to produce end face electrodes, and after the connecting terminals are directly bonded, through hole 27 may be coated with solder (not shown) or the like for more reliable electrical connection. While inductors 28a, 28b of the voltage-controlled oscillator are disposed outside of one-chip IC 20 for oscillation, these inductors may be integrated in one-chip IC 20 if no inductance adjustments are required. The frequency of the voltage-controlled oscillator may be adjusted using capacitors, rather than inductors. In this case, the capacitors, e.g., printed capacitors, for use in frequency adjustments are disposed outside of one-chip IC 20. At any rate, reactance elements for changing frequencies are used to adjust the free-running frequency of the voltage-controlled oscillator.

The PLL-controlled oscillator described above has two voltage-controlled oscillators for signal transmission and reception in view of its application to a transmission/reception system in a mobile phone or the like. If the PLL-controlled oscillator is used for signal transmission or signal reception only, then only one of the voltage-controlled oscillators may be integrated in one-chip IC 20. Inductors 28a, 28b are shown as being disposed on the surface, i.e., a flat face, of cover 25a. However, a recess may be defined in the surface of cover 25a, and inductors may be disposed on the bottom of the recess, so that gaps are reliably provided in the inductors for a higher Q value.

In the above embodiments, quartz crystal panel 21 and covers 25a, 25b are directly bonded to each other under processing conditions for forming a siloxane bond (Si—O—Si). However, processing conditions for forming an Si—Si bond for a higher bonding strength may be employed. A direct bonding process for producing an Si—Si bond is disclosed in Japanese laid-open patent publication No. 2000-269106 (JP, P2000-269106, A), for example.

In the above embodiments, quartz crystal panel 21 and covers 25a, 25b are directly bonded to each other to form crystal unit 3 of the so-called inverted-mesa structure. However, crystal unit 3 is not limited to such a structure. For example, there may be employed a crystal blank having excitation electrodes formed respectively on both principal surfaces and extension electrodes extending from the excitation electrodes, the crystal blank being encapsulated in a hermetically sealed casing.

According to the present invention, a temperature-compensated crystal oscillator as a reference signal source and a voltage-controlled oscillator, which have heretofore been separate from each other, are integrated in an oscillating one-chip IC, excluding or including a reactance element (L or C) of a resonating circuit of the voltage-controlled oscillator, and the one-chip IC is integrally combined with crystal unit 3. Therefore, any PLL-controlled oscillators which are based on the above concept are covered by a technical scope of the present invention.

What is claimed is:

1. A PLL-controlled oscillator comprising:

a temperature-compensated crystal oscillator having a crystal unit, an oscillating circuit connected to said crystal unit, and a temperature compensating mechanism for generating a temperature compensating voltage for compensating for frequency vs. temperature characteristics of said crystal unit; and a voltage-controlled oscillator having an LC oscillating circuit, for being controlled by a PLL using said temperature-compensated crystal oscillator as a reference signal source;

wherein said temperature-compensated crystal oscillator has circuit components except for said crystal unit, said circuit components and said voltage-controlled oscillator are integrated in a one-chip IC, and said one-chip IC and said crystal unit are integrally combined with each other.

2. The PLL-controlled oscillator according to claim 1, wherein said crystal unit comprises a casing, a crystal blank hermetically sealed in said casing, and connecting terminals disposed on an outer surface of said casing and electrically connected to said crystal blank;

said one-chip IC has IC terminals disposed on an outer surface thereof and connected to said connecting terminals; and said crystal unit and said one-chip IC are integrally combined with each other in a laminated structure.

3. The PLL-controlled oscillator according to claim 2, wherein said casing comprises a quartz crystal panel integral with said crystal blank, and a pair of glass panels directly bonded to said quartz crystal panel.

4. A PLL-controlled oscillator comprising:
a temperature-compensated crystal oscillator having a crystal unit, an oscillating circuit connected to said crystal unit, and a temperature compensating mechanism for generating a temperature compensating voltage for compensating for frequency vs. temperature characteristics of said crystal unit; and
a voltage-controlled oscillator having an LC oscillating circuit including an inductor and a capacitor as frequency determining elements, for being controlled by a PLL using said temperature-compensated crystal oscillator as a reference signal source;
wherein said temperature-compensated crystal oscillator has circuit components except for said crystal unit, said voltage-controlled oscillator has circuit components except for either one of said inductor and said capacitor, said circuit components of said temperature-compensated crystal oscillator and said circuit components of said voltage-controlled oscillator are integrated in a one-chip IC, and said one-chip IC and said crystal unit are integrally combined with each other.

5. The PLL-controlled oscillator according to claim 4, wherein said crystal unit comprises a casing, a crystal blank hermetically sealed in said casing, and connecting terminals disposed on an outer surface of said casing and electrically connected to said crystal blank;
said one-chip IC has IC terminals disposed on an outer surface thereof and connected to said connecting terminals; and
said crystal unit and said one-chip IC are integrally combined with each other in a laminated structure.

6. The PLL-controlled oscillator according to claim 5, wherein said one of the inductor and the capacitor is disposed in said casing, and said casing has second connecting terminals disposed on an outer surface thereof and connected to said one of the inductor and the capacitor.

7. The PLL-controlled oscillator according to claim 6, wherein said one of the inductor and the capacitor is formed as a printed element on the inner surface of said casing.

8. A PLL-controlled oscillator comprising:
a casing having a first recess and a second recess which are defined therein;
a temperature-compensated crystal oscillator having a crystal blank, an oscillating circuit connected to said crystal blank, and a temperature compensating mechanism for generating a temperature compensating voltage for compensating for frequency vs. temperature characteristics of said crystal blank; and
a voltage-controlled oscillator having an LC oscillating circuit including an inductor and a capacitor as frequency determining elements, for being controlled by a PLL using said temperature-compensated crystal oscillator as a reference signal source;
wherein said temperature-compensated crystal oscillator has circuit components except for said crystal blank, said voltage-controlled oscillator has circuit components except for either one of said inductor and said capacitor, said circuit components of said temperature-compensated crystal oscillator and said circuit components of said voltage-controlled oscillator are integrated in a one-chip IC;
said one-chip IC and said crystal blank are accommodated in said first recess; and
said one of the inductor and the capacitor are accommodated in said second recess.

9. The PLL-controlled oscillator according to claim 8, further comprising means for shielding said one of the inductor and the capacitor in said second recess.

10. A phase-locked loop (PLL) controlled oscillator comprising:
a temperature-compensated crystal oscillator comprising a crystal unit, an oscillating circuit connected to said crystal unit, and a temperature compensating mechanism for generating a temperature compensating voltage for compensating for frequency vs. temperature characteristics of said crystal unit; and
a voltage-controlled oscillator having an LC oscillating circuit, said voltage-controlled oscillator being controlled by a PLL using said temperature-compensated crystal oscillator as a reference signal source;
wherein said temperature-compensated crystal oscillator includes circuit components other than said crystal unit, and
wherein said voltage-controlled oscillator and said circuit components except for said crystal unit are integrated in a one-chip IC, and said one-chip IC and said crystal unit are integrally combined with each other.

11. A phase-locked loop (PLL) controlled oscillator comprising:
a casing having a first recess and a second recess which are defined therein;
a temperature-compensated crystal oscillator comprising a crystal blank, an oscillating circuit connected to said crystal blank, and a temperature compensating mechanism for generating a temperature compensating voltage for compensating for frequency vs. temperature characteristics of said crystal blank; and
a voltage-controlled oscillator having an LC oscillating circuit including an inductor and a capacitor as frequency determining elements, said voltage-controlled oscillator being controlled by a PLL using said temperature-compensated crystal oscillator as a reference signal source;
wherein said temperature-compensated crystal oscillator includes circuit components other than said crystal blank, and said voltage-controlled oscillator includes circuit components other than either one of said inductor and said capacitor,
wherein said circuit components except for said crystal blank and said circuit components except for either one of said inductor and said capacitor are integrated in a one-chip IC, and
wherein said one-chip IC and said crystal blank are accommodated in said first recess, and said one of said inductor and said capacitor are accommodated in said second recess.

* * * * *